(12) United States Patent
Wang et al.

(10) Patent No.: US 12,538,418 B2
(45) Date of Patent: Jan. 27, 2026

(54) CIRCUIT LAYOUT OF PRINTED CIRCUIT BOARD

(71) Applicant: REALTEK SEMICONDUCTOR CORPORATION, Hsinchu (TW)

(72) Inventors: Chia-Lung Wang, Hsinchu (TW); Min-Hung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 176 days.

(21) Appl. No.: 18/415,699

(22) Filed: Jan. 18, 2024

(65) Prior Publication Data

US 2024/0349421 A1 Oct. 17, 2024

(30) Foreign Application Priority Data

Apr. 13, 2023 (TW) ................................. 112113915

(51) Int. Cl.
*H05K 1/02* (2006.01)
*H01L 23/538* (2006.01)

(52) U.S. Cl.
CPC ....... *H05K 1/0292* (2013.01); *H01L 23/5382* (2013.01); *H05K 2201/09227* (2013.01); *H05K 2201/09409* (2013.01); *H05K 2201/10022* (2013.01); *H05K 2201/10053* (2013.01); *H05K 2201/10363* (2013.01)

(58) Field of Classification Search
CPC ................... H05K 1/02; H05K 1/0292; H05K 2201/09227; H05K 2201/09409; H05K 2201/10022; H01L 23/5382
See application file for complete search history.

(56) References Cited

U.S. PATENT DOCUMENTS

| | | | |
|---|---|---|---|
| 6,222,270 B1 * | 4/2001 | Lee | H01L 24/11 257/773 |
| 9,317,645 B2 * | 4/2016 | Hamouda | G03F 1/36 |
| 2009/0296307 A1 * | 12/2009 | Siamak | B81C 1/00246 438/379 |

* cited by examiner

*Primary Examiner* — Tremesha W Burns
(74) *Attorney, Agent, or Firm* — WPAT, PC

(57) ABSTRACT

A layout without bridge taps includes: a routing from a CPU to a first module through a first set of pads; a routing from a first set of bridge pads to a second module through a second set of pads and a second set of bridge pads; a routing from a third set of pads to a third module; and connectors. The connectors connect pads of the first set of pads to couple the CPU with the first module, or connect the first set of pads with the first set of bridge pads and connect the second set of pads with the second set of bridge pads to couple the CPU with the second module, or connect the first set of pads with the first set of bridge pads and connect the second set of pads with the third set of pads to couple the CPU with the third module.

13 Claims, 10 Drawing Sheets

CIRCUIT LAYOUT OF PRINTED CIRCUIT BOARD

BACKGROUND OF THE INVENTION

1. Field of the Invention

The present disclosure relates to a circuit layout of a printed circuit board (PCB), especially to a circuit layout of a PCB without unwanted bridge taps.

2. Description of Related Art

According to implementation needs, a central processing unit (CPU) set on a printed circuit board (PCB) needs to be electrically coupled with one of multiple modules set on the same PCB. In consideration of production or utilization convenience, multiple routings are formed on the PCB for electrically coupling the CPU with the multiple modules. In addition, spaces on the PCB are reserved for the setting of the CPU and the setting of one of the multiple modules.

FIG. 1 shows a circuit layout of a prior art which allows a CPU to be electrically coupled with one of multiple modules through one of multiple routings. As shown in FIG. 1, the circuit layout 110 is formed on a PCB 10 and includes a setting space 112 for a CPU, a setting space 114 for a first module, a setting space 116 for a second module, and a setting space 118 for a third module. The circuit layout 110 further includes a first routing 122 (i.e., the black fine lines in FIG. 1), a second routing 124 (i.e., the black bold lines in FIG. 1), and a third routing 126 (i.e., the black dotted lines in FIG. 1). The first routing 122 is disposed between the setting space 112 for the CPU and the setting space 114 for the first module; the second routing 124 is disposed between the third routing 126 and the setting space 116 for the second module; and the third routing 126 is disposed between the first routing 122 and the setting space 118 for the third module, wherein each routing includes bonding pads (i.e., the light-gray boxes in FIG. 1) that are electrically separated by themselves. It is noted that the third routing 126 (i.e., the routing illustrated with dotted lines in FIG. 1) is formed on the back of the PCB 10 while the other routings (i.e., the routing illustrated with solid lines in FIG. 1) are formed on the front of the PCB 10, wherein the routings on the front can be electrically coupled with the routing on the back through vias (i.e., the black dots on the routings in FIG. 1).

Referring to FIG. 1, a CPU should only be coupled with one of the multiple modules rather than all of the multiple modules in practice. Accordingly, only one of the first routing 122, the second routing 124, and the third routing 126 should conduct electricity. When the circuit layout 110 is used for coupling the CPU with the first module, the electrically separate bonding pads of the first routing 112 are connected by a zero-ohm resistor (not shown in FIG. 1) through bonding/mounting/attachment; meanwhile, the transmission lines coupled between the first routing 122 and the bonding pads of the third routing 126 are left as bridge taps, and the transmission lines coupled between the third routing 126 and the bonding pads of the second routing 124 are also left as bridge taps. Similarly, when the circuit layout 110 is used for coupling the CPU with the second module/the third module, the electrically separate bonding pads of the second routing 124/the third routing 126 are connected by a zero-ohm resistor through bonding/mounting/attachment; meanwhile the transmission lines leading to the other two modules are left as bridge taps. The above-mentioned bridge taps seriously affect the transmission of high-speed signals and may cause malfunction.

SUMMARY OF THE INVENTION

An object of the present disclosure is to provide a circuit layout of a printed circuit board (PCB) without unwanted bridge taps.

An embodiment of the circuit layout of the PCB of the present disclosure includes a first routing, a second routing, and at least one set of connection component(s). The first routing includes a first set of front-end transmission line(s), a first set of bonding pads, a first set of bridge pads, and a first set of back-end transmission line(s), wherein: the first set of front-end transmission line(s) is coupled with a transmission interface of a central processing unit (CPU) and coupled with the first set of bonding pads; the first set of bonding pads includes a plurality of first bonding pads, in which any two of the first bonding pads by themselves are separate; the first set of bridge pads includes a plurality of first bridge pads, in which any two of the first bridge pads by themselves are separate while any one of the first bridge pads and any one of the first bonding pads by themselves are separate; and when the circuit layout is used for a first purpose, the first set of back-end transmission line(s) is coupled with the first set of bonding pads and coupled with a transmission interface of a first module. The second routing includes a second set of front-end transmission line(s), a second set of front-end pads, a second set of bridge pads, and a second set of transmission circuit(s), wherein: the second set of front-end transmission line(s) is coupled with the first set of bridge pads and coupled with the second set of front-end pads; the second set of front-end pads includes a plurality of second front-end bonding pads, in which any two of the second front-end bonding pads alone are separate; the second set of bridge pads includes a plurality of second bridge pads, in which any two of the second bridge pads alone are separate while any one of the second bridge pads and any one of the second front-end bonding pads alone are separate; and when the circuit layout is used for a second purpose, the second set of transmission circuit(s) is coupled with the second set of bridge pads and coupled with a transmission interface of a second module. When the circuit layout is used for the first purpose, the at least one set of connection component(s) includes a first set of connection component(s), wherein the first set of connection component(s) couples multiple bonding pads of the first bonding pads together and thereby electrically couples the first set of front-end transmission line(s) with the first set of back-end transmission line(s) so that the transmission interface of the CPU is electrically coupled with the transmission interface of the first module while the first set of bonding pads and the first set of bridge pads are electrically separate. When the circuit layout is used for the second purpose, the at least one set of connection component(s) includes a second set of connection component(s) and a third set of connection component(s), wherein the second set of connection component(s) couples the first set of bonding pads with the first set of bridge pads and thereby electrically couples the first set of front-end transmission line(s) with the second set of front-end transmission line(s), and the third set of connection component(s) couples the second set of front-end pads with the second set of bridge pads and thereby electrically couples the second set of front-end transmission line(s) with the second set of transmission circuit(s) so that the transmission interface of the CPU is electrically coupled with the transmission interface of the second module while any two of the first bonding pads are electrically separate.

Another embodiment of the circuit layout of the PCB of the present disclosure includes a first routing, a second routing, and at least one set of connection component(s). The first routing includes a first set of front-end transmission line(s), a first set of bonding pads, a first set of bridge pads, and a first set of back-end transmission line(s), wherein: the first set of front-end transmission line(s) is coupled with a transmission interface of a CPU and coupled with the first set of bonding pads; the first set of bonding pads includes a plurality of first bonding pads, in which any two of the first bonding pads by themselves are separate; the first set of bridge pads includes a plurality of first bridge pads, in which any two of the first bridge pads by themselves are separate while any one of the first bridge pads and any one of the first bonding pads by themselves are separate; and when the circuit layout is used for a first purpose, the first set of back-end transmission line(s) is coupled with the first set of bonding pads and coupled with a transmission interface of a first module. The second routing including a second set of transmission circuit(s), wherein when the circuit layout is used for a second purpose, the second set of transmission circuit(s) is coupled with the first set of bridge pads and coupled with a transmission interface of a second module. When the circuit layout is used for the first purpose, the at least one set of connection component(s) includes a first set of connection component(s), wherein the first set of connection component(s) couples multiple bonding pads of the first bonding pads together and thereby electrically couples the first set of front-end transmission line(s) with the first set of back-end transmission line(s) so that the transmission interface of the CPU is electrically coupled with the transmission interface of the first module while the first set of bonding pads and the first set of bridge pads are electrically separate. When the circuit layout is used for the second purpose, the at least one set of connection component(s) includes a second set of connection component(s), wherein the second set of connection component(s) couples the first set of bonding pads with the first set of bridge pads and thereby electrically couples the first set of front-end transmission line(s) with the second set of transmission circuit(s) so that the transmission interface of the CPU is electrically coupled with the transmission interface of the second module while any two of the first bonding pads are electrically separate.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 3 shows a first embodiment of the second set of transmission circuit(s) of FIG. 2a.

FIG. 4 shows a second embodiment of the second set of transmission circuit(s) of FIG. 2a.

FIG. 5 shows a modification of the embodiment of FIG. 2a.

FIG. 6a shows a modification of the embodiment of FIG. 2a.

FIG. 6b shows a modification of the embodiment of FIG. 2a.

DETAILED DESCRIPTION OF THE PREFERRED EMBODIMENTS

The present specification discloses a circuit layout of a printed circuit board (PCB). The circuit layout can couple a central processing unit (CPU) with one of multiple modules according to implementation needs in a manner without unwanted bridge taps so that the circuit layout can prevent the transmission of high-speed signals from being affected by the unwanted bridge taps. It is noted that the circuit layout may include bridge taps that are retained intentionally, but this falls beyond the scope of the present disclosure.

Figure 1:
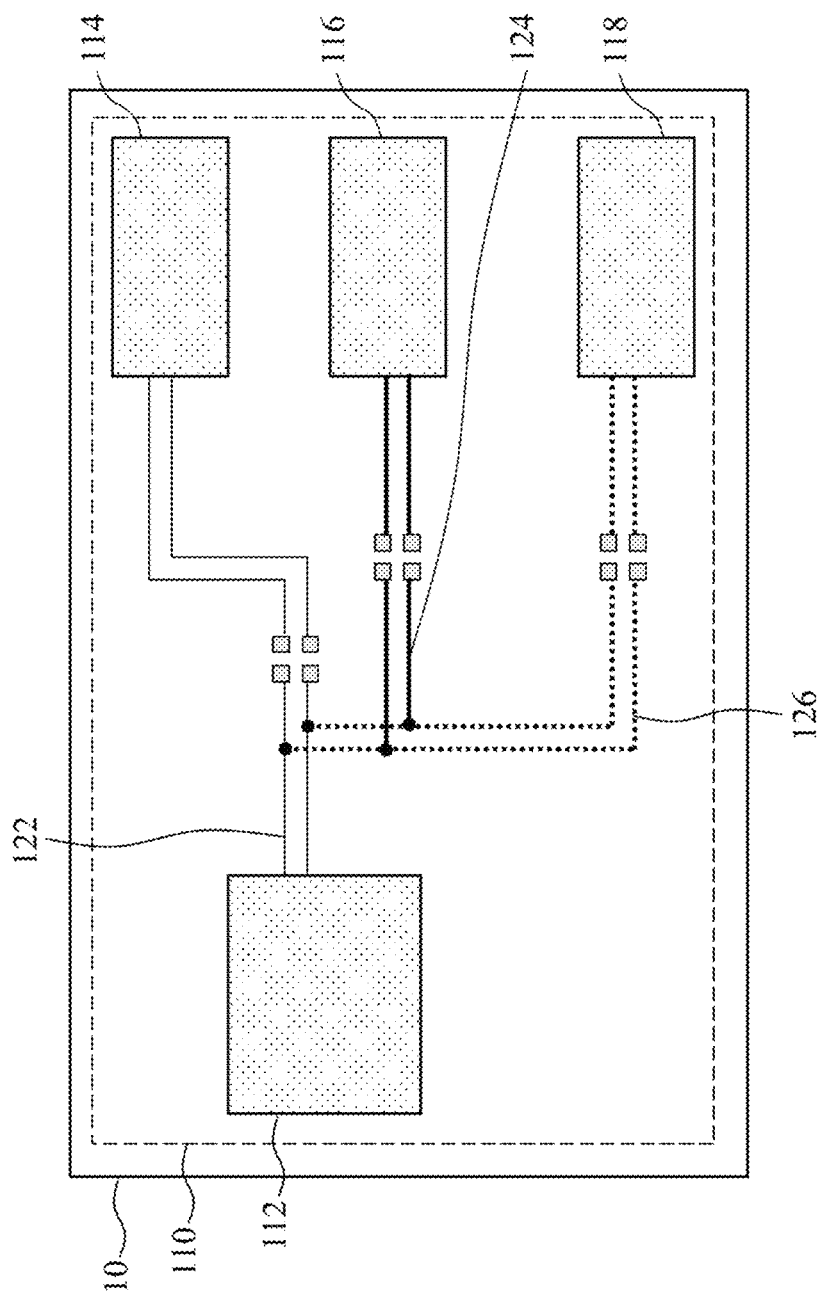
FIG. 1 shows a circuit layout of a prior art.
Figure 2A:
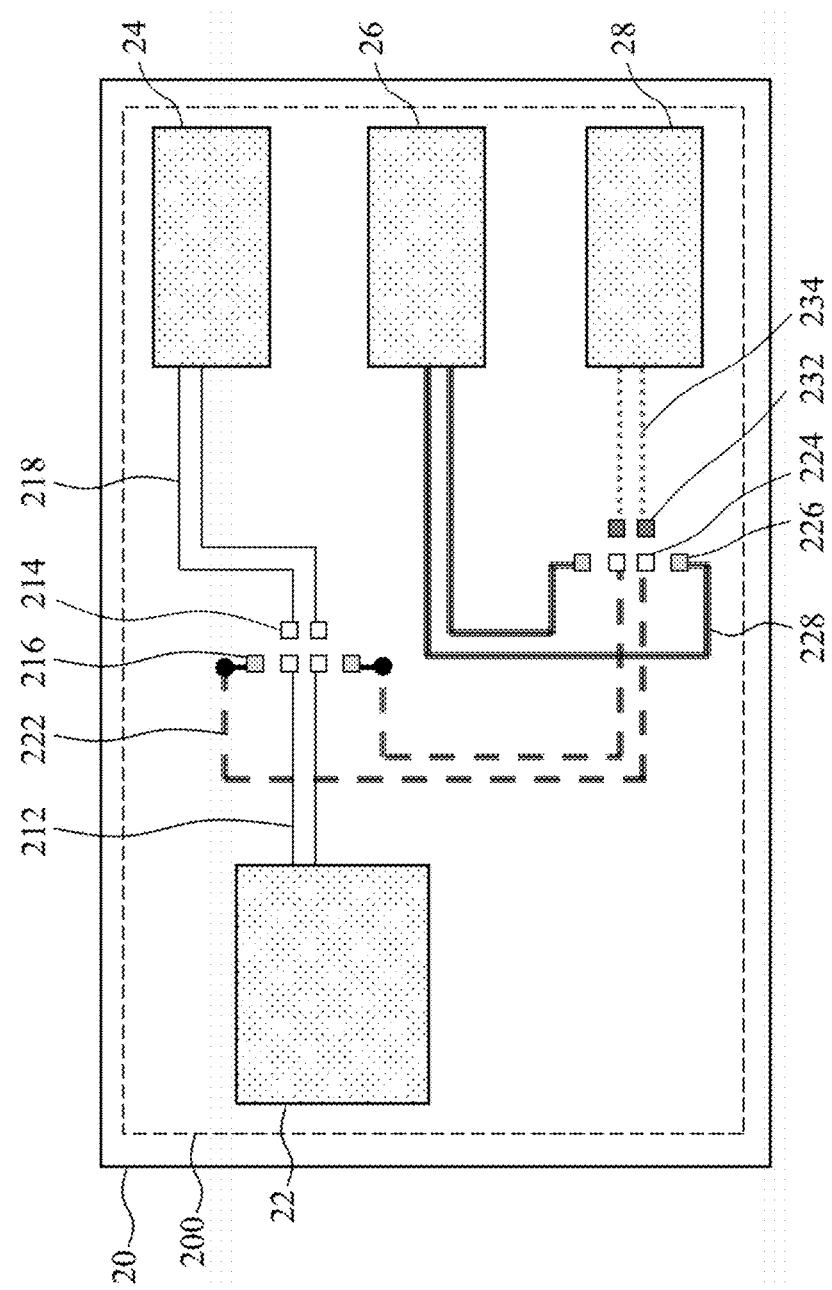
FIG. 2a shows an embodiment of the circuit layout of a PCB of the present disclosure.
Figure 2B:
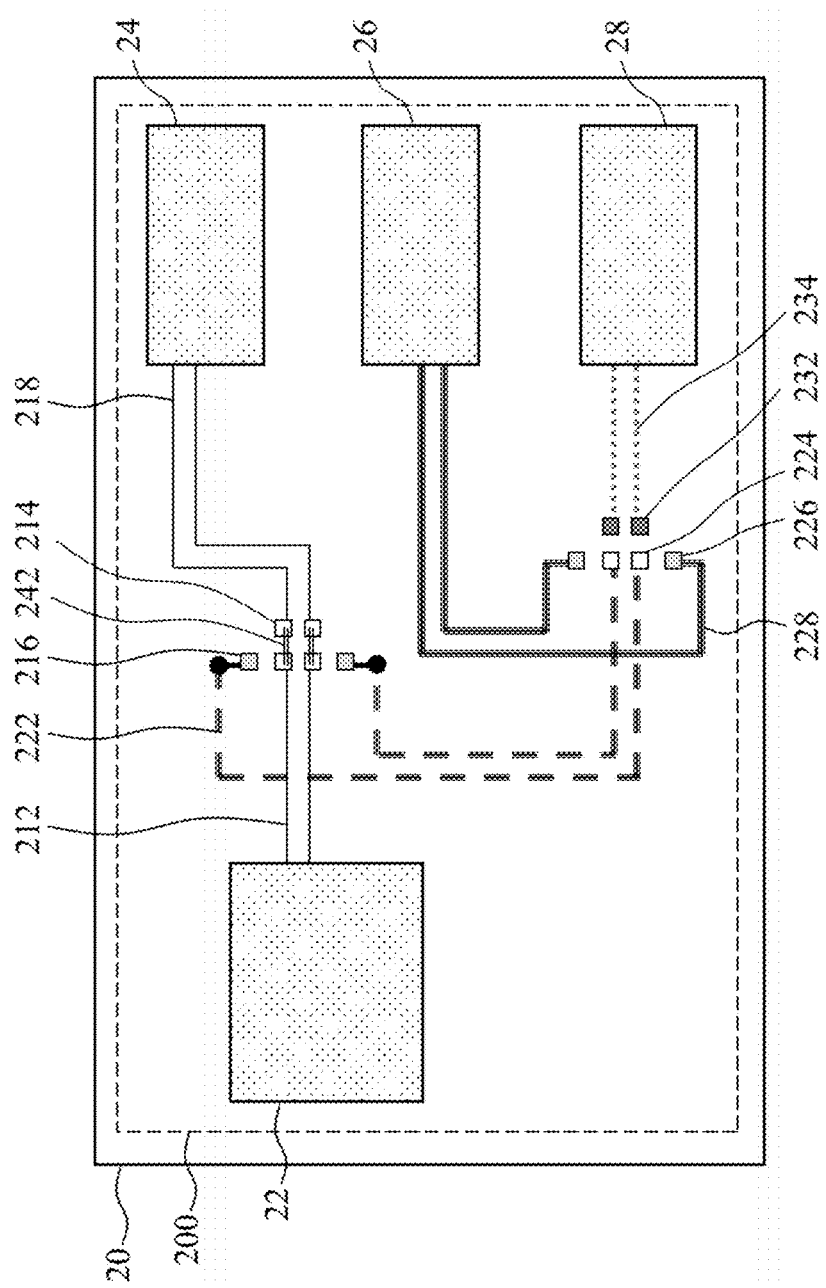
FIG. 2b shows how to set at least one set of connection component(s) when the circuit layout of FIG. 2a is used for a first purpose.
Figure 2C:
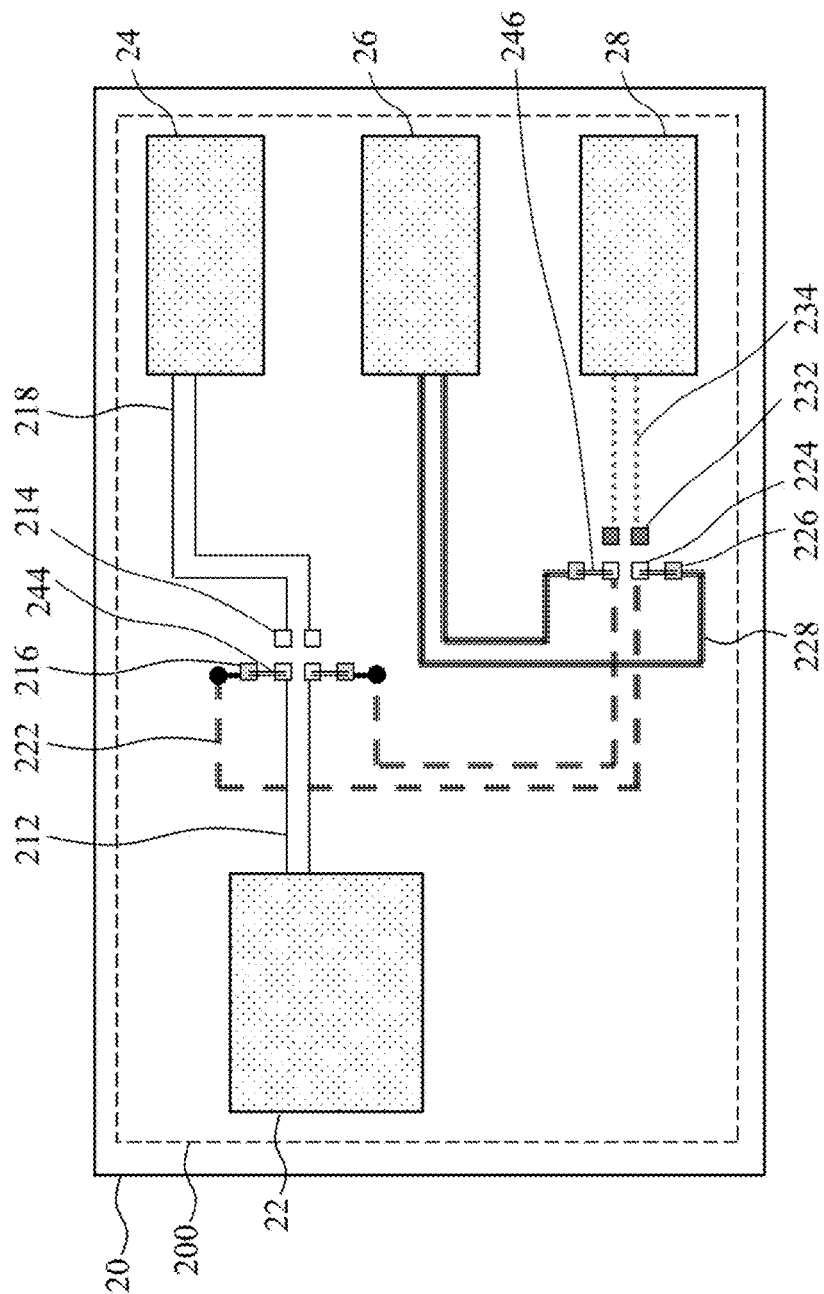
FIG. 2c shows how to set at least one set of connection component(s) when the circuit layout of FIG. 2a is used for a second purpose.
Figure 2D:
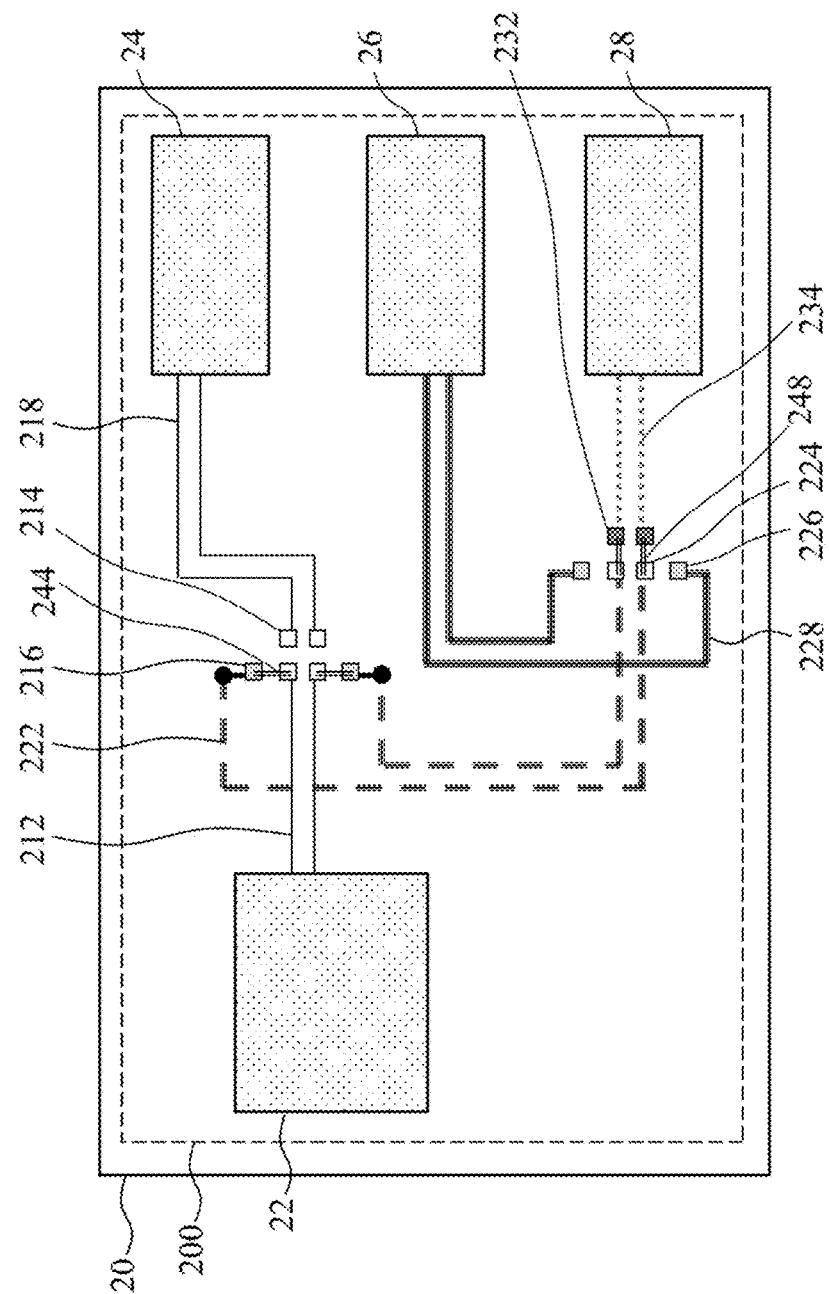
FIG. 2d shows how to set at least one set of connection component(s) when the circuit layout of FIG. 2a is used for a third purpose.

FIG. 2a shows an embodiment of the circuit layout of the PCB of the present disclosure. The circuit layout 200 of the PCB 20 in FIG. 2a includes a first routing (i.e., the black fine solid line in FIG. 2a), a second routing (i.e., the black composite dashed line and black composite solid line in FIG. 2a), a third routing (i.e., the gray dotted line in FIG. 2a), and at least one set of connection component(s) (as shown in FIG. 2b~2d). On the PCB 20 are reserved spaces including: a CPU setting space 22 for the setting of a CPU; a first module setting space 24 for the setting of a first module; a second module setting space 26 for the setting of a second module; and a third module setting space 28 for the setting of a third module. The first routing is used for electrically coupling a transmission interface of the CPU with a transmission interface of the first module; the second routing is used for coupling the transmission interface of the CPU with a transmission interface of the second module; and the third routing is used for coupling the transmission interface of the CPU with a transmission interface of the third module. An embodiment of each of the above-mentioned transmission interfaces is a Serializer/Deserializer (SerDes) interface, but the implementation of the present invention is not limited thereto. Referring to the first routing, the second routing, and the third routing in FIG. 2a, the routing(s) on a first surface of the PCB 20 (e.g., the front of the PCB 20) is/are illustrated with solid line(s) while the routing(s) on a second surface of the PCB (e.g., the back of the PCB 20) is/are illustrated with dashed/dotted line(s). The details of the first routing, the second routing, and the third routing are described in the following paragraphs.

Referring to FIG. 2a, the first routing includes a first set of front-end transmission line(s) 212, a first set of bonding pads 214 (i.e., the white small boxes of the first routing in FIG. 2a), a first set of bridge pads 216 (i.e., the gray small boxes of the first routing in FIG. 2a), and a first set of back-end transmission line(s) 218. The first set of front-end transmission line(s) 212 is coupled with the transmission interface of the CPU and coupled with the first set of bonding pads 214. The first set of bonding pads 214 includes a plurality of first bonding pads, in which any two of the first bonding pads alone are separate. The first set of bridge pads 216 includes a plurality of first bridge pads, in which any two of the first bridge pads alone are separate while any one of the first bridge pads and any one of the first bonding pads alone are separate. The first set of back-end transmission line(s) 218 is coupled with the first set of bonding pads 214, and when the circuit layout 200 is used for a first purpose, the first set of back-end transmission line(s) 218 is coupled with the transmission interface of the first module. It is noted that the first routing is formed on the first surface of the PCB 20.

Referring to FIG. 2a, the second routing includes a second set of front-end transmission line(s) 222, a second set of front-end pads 224 (i.e., the white small boxes of the second routing in FIG. 2a), a second set of bridge pads 226 (i.e., the gray small boxes of the second routing in FIG. 2a), and a second set of transmission circuit(s) 228. The second set of front-end transmission line(s) 222 is coupled with the first set of bridge pads 216 and coupled with the second set of front-end pads 224. The second set of front-end pads 224 includes a plurality of second front-end bonding pads, in which any two of the second front-end bonding pads alone are separate. The second set of bridge pads 226 includes a plurality of second bridge pads, in which any two of the second bridge pads alone are separate while any one of the second bridge pads and any one of the second front-end bonding pads alone are separate. The second set of transmission circuit(s) 228 is coupled with the second set of bridge pads 226, and when the circuit layout 200 is used for a second purpose, the second set of transmission circuit(s) 228 is coupled with the transmission interface of the second module. It is noted that a part of the second routing (i.e., the part from the first set of bridge pads 216 to the second set of front-end pads 224) is formed on the second surface of the PCB 20 while another part of the second routing (i.e., the part from the second set of the bridge pads 226 to the transmission interface of the second module) is formed on the first surface of the PCB 20; accordingly, the second routing further includes vias (i.e., the black circles in FIGS. 2a~2d) for coupling the part of the second routing on the first surface and the another part of the second routing on the second surface. It is also noted that means (e.g., traces) for coupling pads to vias may be used.

Referring to FIG. 2a, the third routing includes a third set of bonding pads 232 (i.e., the dark-gray small boxes of the third routing in FIG. 2a) and a third set of transmission line(s) 234. The third set of transmission line(s) 234 is coupled with the third set of bonding pads 232, and when the circuit layout is used for a third purpose, the third set of transmission line(s) 234 is coupled with the transmission interface of the third module. It is noted that an embodiment of each set of transmission line(s) in FIG. 2a is a set of trace(s) or any known/self-developed means for signal transmission.

FIG. 2b shows how to set the at least one set of connection component(s) when the circuit layout 200 is used for the first purpose. As shown in FIG. 2b, the at least one set of connection component(s) includes a first set of connection component(s) 242. The first set of connection component(s) 242 couples multiple bonding pads of the first bonding pads 214 together and thereby electrically couples the first set of front-end transmission line(s) 212 with the first set of back-end transmission line(s) 218 so that the transmission interface of the CPU is electrically coupled with the transmission interface of the first module; meanwhile, the first set of bonding pads 214 and the first set of bridge pads 216 are electrically separate, which means both the path from the CPU to the second module and the path from the CPU to the third module are not electrically conductive. An embodiment of the at least one set of connection component(s) includes at least one of the following: a zero-ohm resistor; a jumper; and a dual in-line package (DIP) switch.

FIG. 2c shows how to set the at least one set of connection component(s) when the circuit layout 200 is used for the second purpose. As shown in FIG. 2c, the at least one set of connection component(s) includes a second set of connection component(s) 244 and a third set of connection component(s) 246. The second set of connection component(s) 244 couples the first set of bonding pads 214 with the first set of bridge pads 216 and thereby electrically couples the first set of front-end transmission line(s) 212 with the second set of front-end transmission line(s) 222; the third set of connection component(s) 246 couples the second set of front-end pads 224 with the second set of bridge pads 226 and thereby electrically couples the second set of front-end transmission line(s) 222 with the second set of transmission circuit(s) 228 so that the transmission interface of the CPU is electrically coupled with the transmission interface of the second module; meanwhile, any two of the first bonding pads 214 are electrically separate and the second set of front-end pads 224 and the third set of bonding pads 232 are electrically separate, which means both the path from the CPU to the first module and the path from the CPU to the third module are not electrically conductive.

FIG. 2d shows how to set the at least one set of connection component(s) when the circuit layout 200 is used for the third purpose. As shown in FIG. 2d, the at least one set of connection component(s) includes the aforementioned second set of connection component(s) 244 and a fourth set of connection component(s) 248. As stated above, the second set of connection component(s) 244 couples the first set of bonding pads 214 with the first set of bridge pads 216; and the fourth set of connection component(s) 248 couples the second set of front-end pads 224 with the third set of bonding pads 232 and thereby electrically couples the second set of front-end transmission line(s) 222 with the third set of transmission line(s) 234 so that the transmission interface of the CPU is electrically coupled with the transmission interface of the third module; meanwhile, any two of the first bonding pads 214 are electrically separate and the second set of front-end pads 224 and the second set of bridge pads 226 are electrically separate, which means both the path from the CPU to the first module and the path from the CPU to the second module are not electrically conductive.

Figure 3:
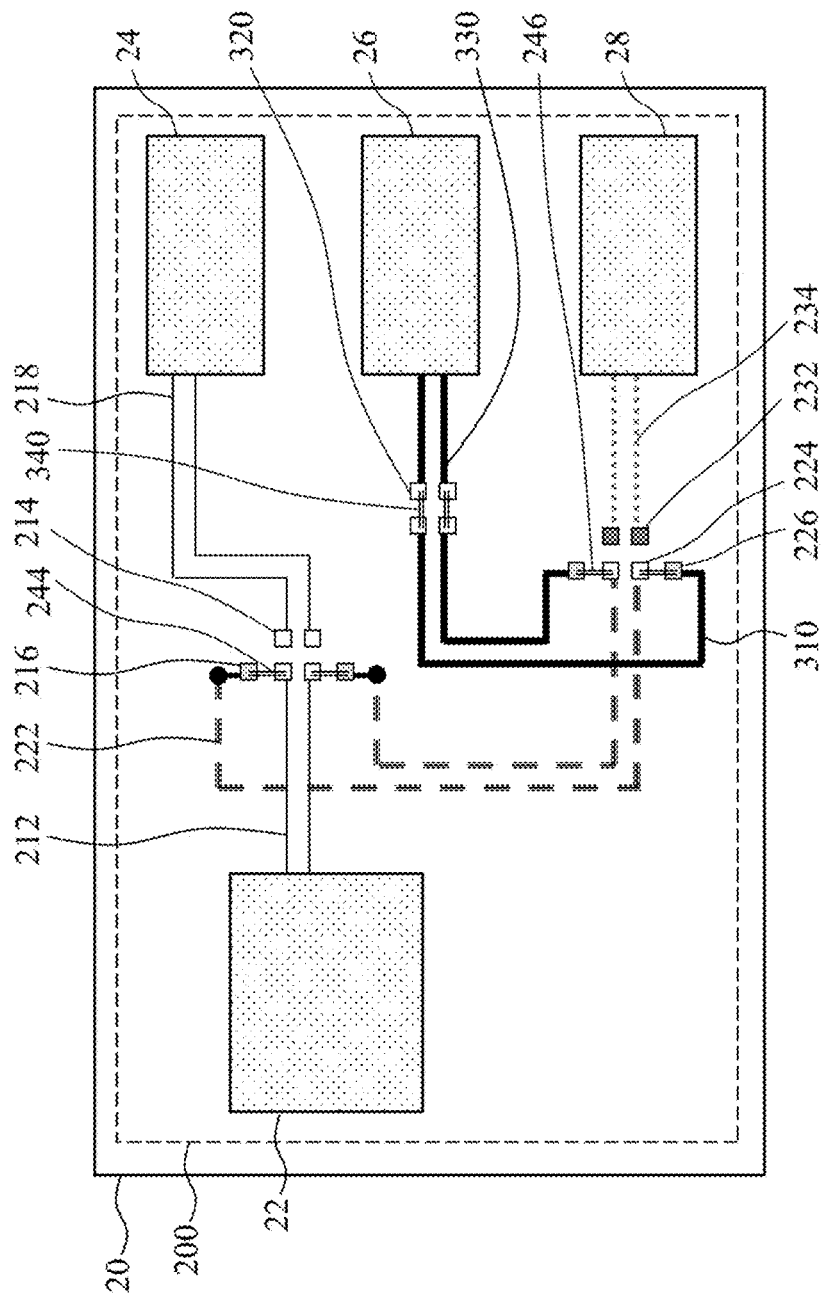

FIG. 3 shows a first embodiment of the second set of transmission circuit(s) 228 of FIG. 2a. As shown in FIG. 3, the second set of transmission circuit(s) 228 includes a second set of middle transmission line(s) 310, a second set of back-end pads 320, and a second set of back-end transmission line(s) 330. The second set of middle transmission line(s) 310 is coupled with the second set of bridge pads 226 and coupled with the second set of back-end pads 320. The second set of back-end pads 320 includes a plurality of second back-end bonding pads, in which any two of the second back-end bonding pads by themselves are separate. The second set of back-end transmission line(s) 330 is coupled with the second set of back-end pads 320, and when the circuit layout 200 is used for the second purpose, the second set of back-end transmission line(s) 330 is coupled with the transmission interface of the second module. In the embodiment of FIG. 3, when the circuit layout 200 is used for the second purpose, the at least one set of connection component(s) further includes a set of connection component(s) 340 which couples multiple bonding pads of the second back-end bonding pads 320 together and thereby electrically couples the second set of middle transmission line(s) 310 with the second set of back-end transmission line(s) 330.

Figure 4:
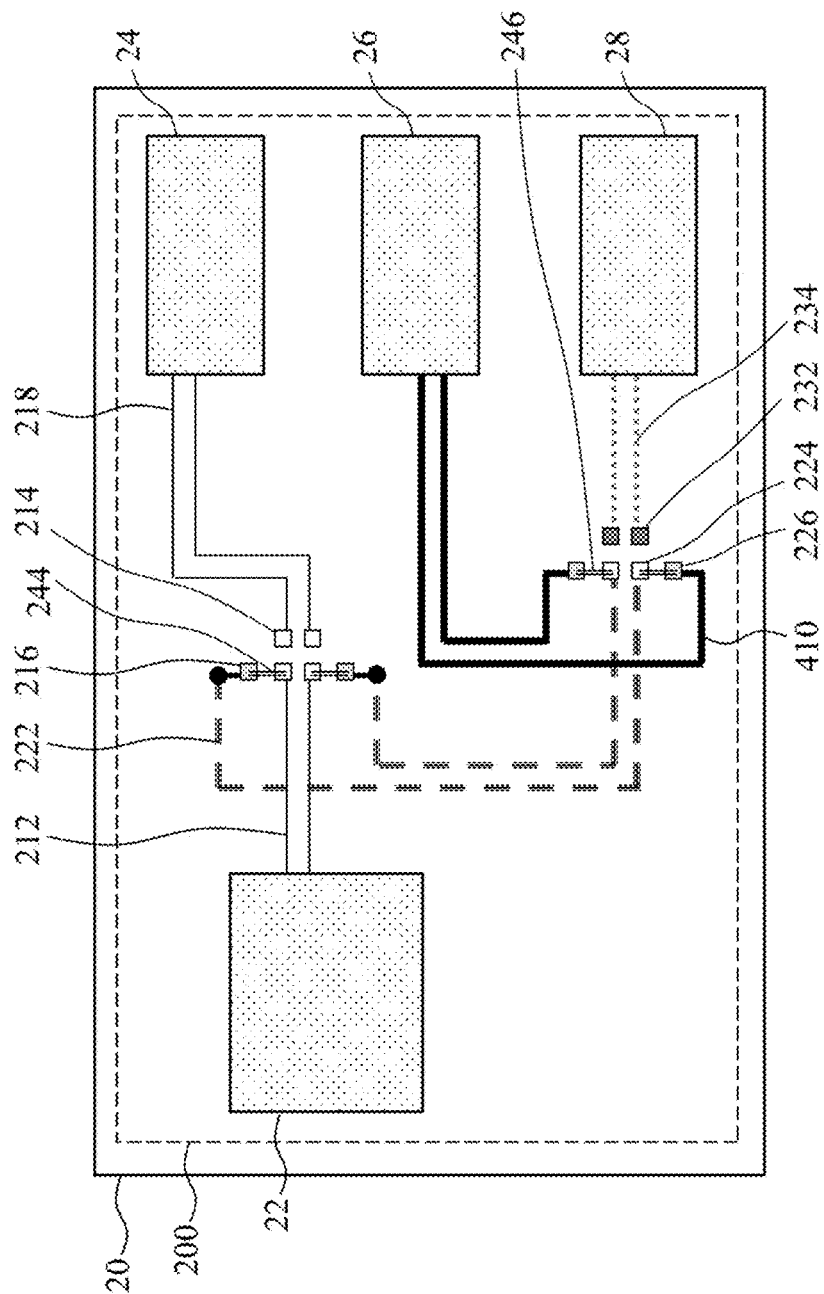

FIG. 4 shows a second embodiment of the second set of transmission circuit(s) 228 of FIG. 2*a*. As shown in FIG. 4, the second set of transmission circuit(s) 228 includes a second set of back-end transmission line(s) 410. The second set of back-end transmission line(s) 410 is coupled with the second set of bridge pads 226, and when the circuit layout 200 is used for the second purpose, the second set of back-end transmission line(s) 410 is coupled with the transmission interface of the second module.

Figure 5:
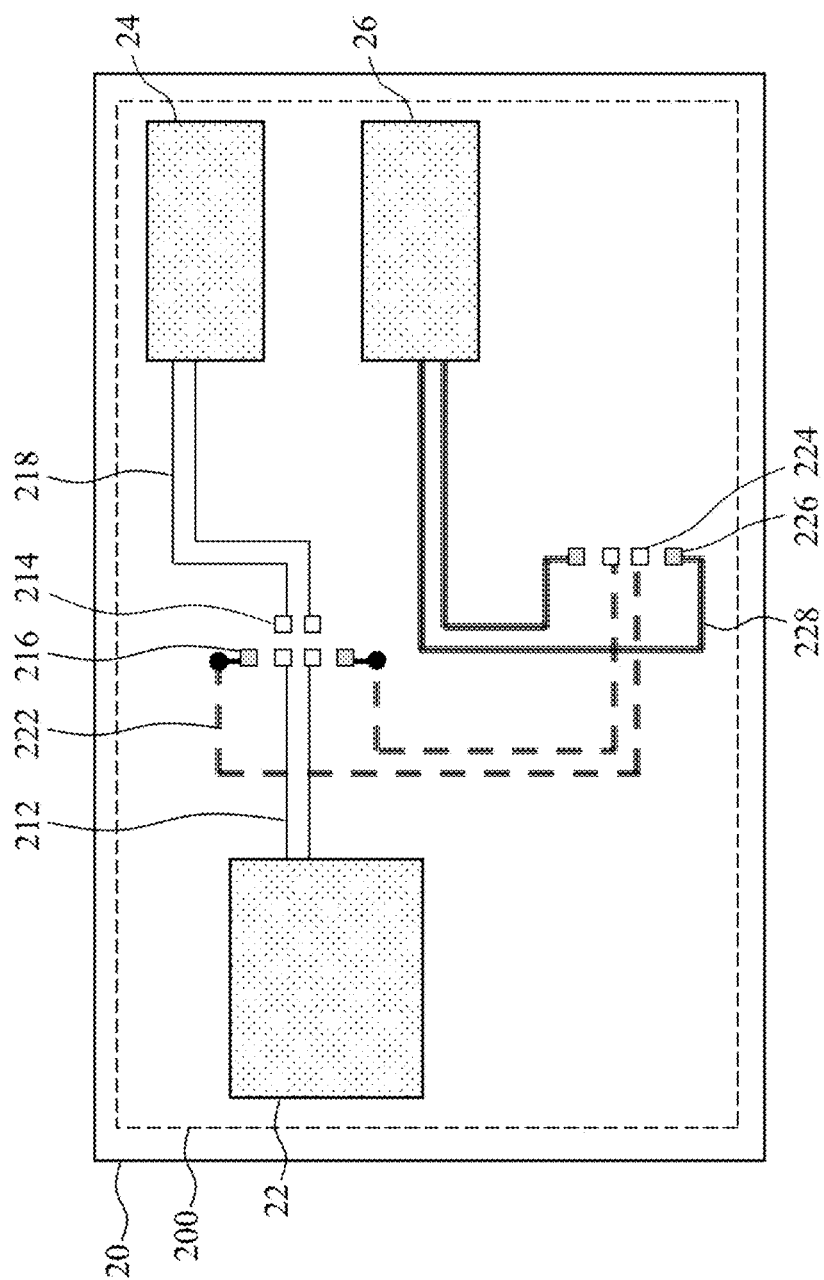
Figure 6A:
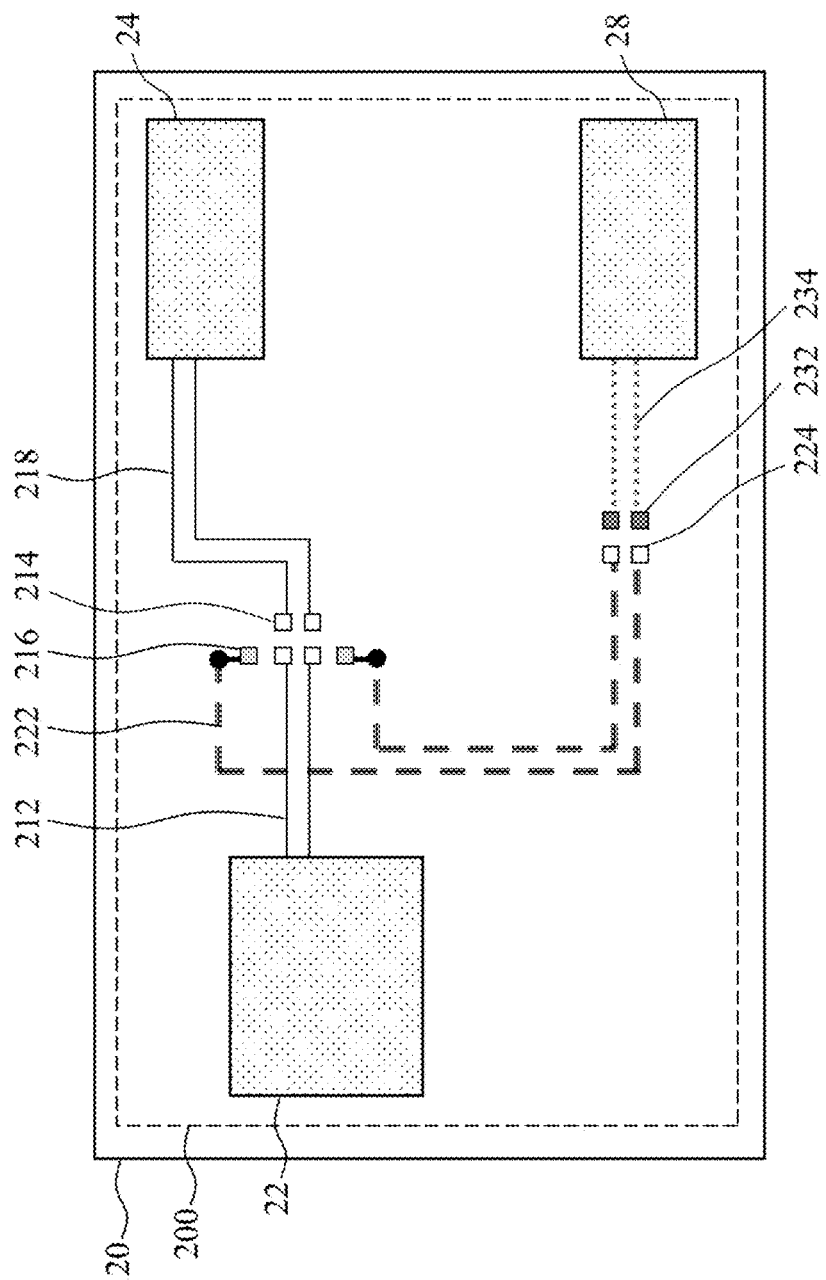
Figure 6B:
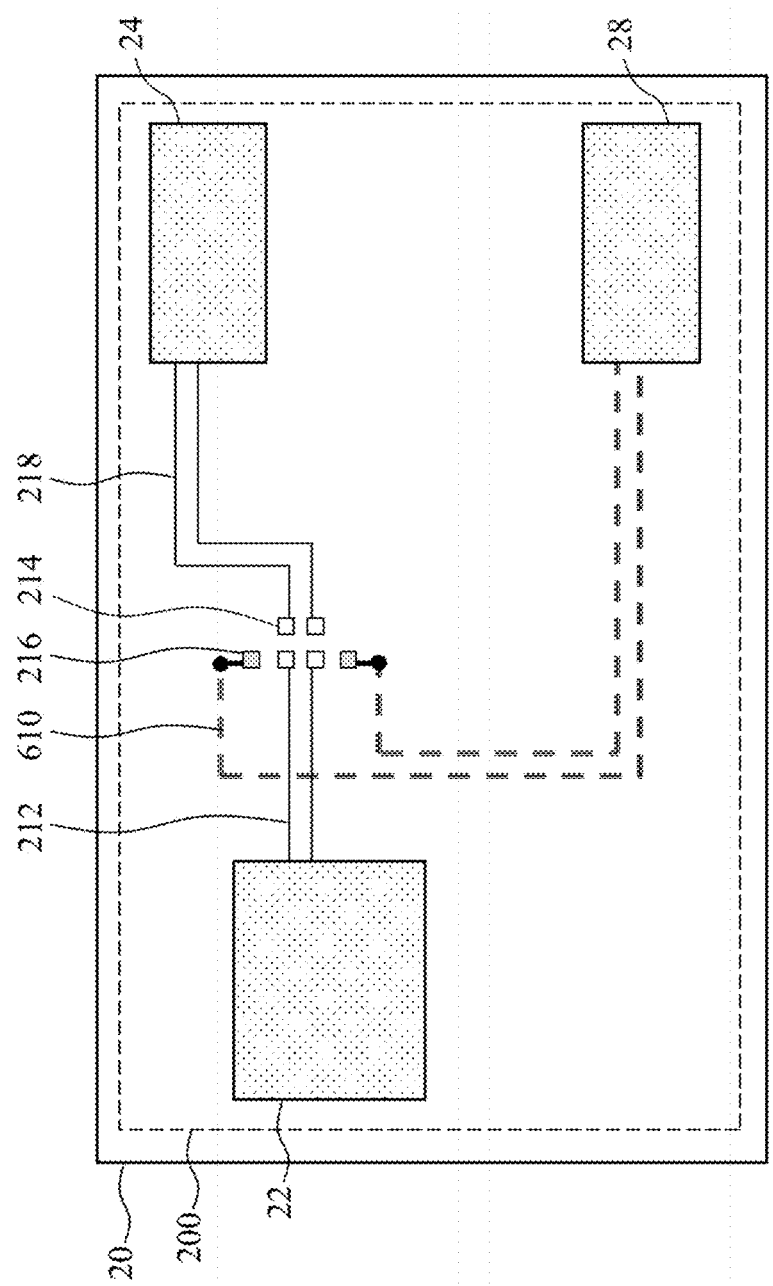

In an alternative embodiment as shown in FIG. 5, the circuit layout 200 of FIG. 2*a* is modified and merely used for electrically coupling the CPU with one of the first module and the second module. In the embodiment of FIG. 5: since the CPU needn't be coupled with the third module, the third routing is omitted and the third module setting space 28 is omitted as well. It is noted that the second set of transmission circuit(s) 228 may be directly coupled to the second set of front-end pads 224 without using the second set of bridge pads 226. In an alternative embodiment as shown in FIG. 6*a*, the circuit layout 200 of FIG. 2*a* is modified and merely used for electrically coupling the CPU with one of the first module and the third module. In the embodiment of FIG. 6*a*: since the CPU needn't be coupled with the second module, a part of the second routing (i.e., the part from the second set of bridge pads 226 to the transmission interface of the second module in FIG. 2*a*) is omitted and the second module setting space 26 is omitted as well; meanwhile, another part of the second routing (i.e., the second set of front-end transmission line(s) 222 from the first set of bridge pads 216 to the second set of front-end pads 224 in FIG. 6*a*) is still necessary and functions as a part of the path from the CPU to the transmission interface of the third module. In an alternative embodiment as shown in FIG. 6*b*, the circuit layout 200 of FIG. 2*a* is modified and merely used for electrically coupling the CPU with one of the first module and the third module. In the embodiment of FIG. 6*b*: the second routing can be omitted while the third routing includes a set of transmission line(s) 610 for coupling the first set of bridge pads 216 with the transmission interface of the third module.

Since those having ordinary skill in the art can refer to the embodiments of FIGS. 2*a*~4 to appreciate the details and the modifications of the aforementioned alternative embodiments, repeated and redundant description is omitted.

It is noted that people having ordinary skill in the art can selectively use some or all of the features of any embodiment in this specification or selectively use some or all of the features of multiple embodiments in this specification to implement the present invention as long as such implementation is practicable; in other words, the way to implement the present invention is flexible based on the present disclosure.

To sum up, the circuit layout of the PCB of the present disclosure can couple a CPU with one of multiple modules according to implementation needs and can carry out the coupling without leaving unwanted bridge taps. Accordingly, the circuit layout can prevent the influence of bridge taps on the transmission of high-speed signals.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A circuit layout of a printed circuit board (PCB), the circuit layout comprising: a first routing including a first set of front-end transmission line(s), a first set of bonding pads, a first set of bridge pads, and a first set of back-end transmission line(s), wherein: the first set of front-end transmission line(s) is coupled with a transmission interface of a central processing unit (CPU) and coupled with the first set of bonding pads; the first set of bonding pads includes first bonding pads, wherein any two of the first bonding pads alone are separate; the first set of bridge pads includes first bridge pads, wherein any two of the first bridge pads alone are separate while any one of the first bridge pads and any one of the first bonding pads alone are separate; and when the circuit layout is used for a first purpose, the first set of back-end transmission line(s) is coupled with the first set of bonding pads and coupled with a transmission interface of a first module; a second routing including a second set of front-end transmission line(s), a second set of front-end pads, a second set of bridge pads, and a second set of transmission circuit(s), wherein: the second set of front-end transmission line(s) is coupled with the first set of bridge pads and coupled with the second set of front-end pads; the second set of front-end pads includes a plurality of second front-end bonding pads, wherein any two of the second front-end bonding pads alone are separate; the second set of bridge pads includes second bridge pads, wherein any two of the second bridge pads alone are separate while any one of the second bridge pads and any one of the second front-end bonding pads alone are separate; and when the circuit layout is used for a second purpose, the second set of transmission circuit(s) is coupled with the second set of bridge pads and coupled with a transmission interface of a second module; and at least one set of connection component(s), wherein: when the circuit layout is used for the first purpose, the at least one set of connection component(s) includes a first set of connection component(s), in which the first set of connection component(s) couples multiple bonding pads of the first bonding pads together and thereby electrically couples the first set of front-end transmission line(s) with the first set of back-end transmission line(s) so that the transmission interface of the CPU is electrically coupled with the transmission interface of the first module while the first set of bonding pads and the first set of bridge pads are electrically separate; and when the circuit layout is used for the second purpose, the at least one set of connection component(s) includes a second set of connection component(s) and a third set of connection component(s), in which the second set of connection component(s) couples the first set of bonding pads with the first set of bridge pads and thereby electrically couples the first set of front-end transmission line(s) with the second set of front-end transmission line(s), and the third set of connection component(s) couples the second set of front-end pads with the second set of bridge pads and thereby electrically couples the second set of front-end transmission line(s) with the second set of transmission circuit(s) so that the transmission interface of the CPU is electrically coupled with the transmission interface of the second module while any two of the first bonding pads are electrically separate.

2. The circuit layout of claim 1, wherein the second set of transmission circuit(s) includes a second set of middle transmission line(s), a second set of back-end pads, and a second set of back-end transmission line(s); the second set of middle transmission line(s) is coupled with the second set of bridge pads and coupled with the second set of back-end pads; the second set of back-end pads includes second back-end bonding pads, wherein any two of the second back-end bonding pads alone are separate; the second set of back-end transmission line(s) is coupled with the second set of back-end pads, and when the circuit layout is used for the second purpose, the second set of back-end transmission line(s) is coupled with the transmission interface of the second module; and when the circuit layout is used for the second purpose, the at least one set of connection component(s) further includes a fourth set of connection component(s) which couples multiple bonding pads of the second back-end bonding pads together and thereby electrically couples the second set of middle transmission line(s) with the second set of back-end transmission line(s).

3. The circuit layout of claim 1, wherein the second set of transmission circuit(s) includes a second set of back-end transmission line(s), the second set of back-end transmission line(s) is coupled with the second set of bridge pads, and when the circuit layout is used for the second purpose, the second set of back-end transmission line(s) is coupled with the transmission interface of the second module.

4. The circuit layout of claim 1, further comprising:
a third routing including a third set of bonding pads and a third set of transmission line(s), wherein:
the third set of transmission line(s) is coupled with the third set of bonding pads, and is coupled with a transmission interface of a third module when the circuit layout is used for a third purpose; and
when the circuit layout is used for the third purpose, the at least one set of connection component(s) includes the second set of connection component(s) and a fourth set of connection component(s); the second set of connection component(s) couples the first set of bonding pads with the first set of bridge pads and thereby electrically couples the first set of front-end transmission line(s) with the second set of front-end transmission line(s); and the fourth set of connection component(s) couples the second set of front-end pads with the third set of bonding pads and thereby electrically couples the second set of front-end transmission line(s) with the third set of transmission line(s) so that the transmission interface of the CPU is electrically coupled with the transmission interface of the third module.

5. The circuit layout of claim 1, wherein the first routing is formed on a first surface of the PCB; a part of the second routing is formed on the first surface of the PCB and another part of the second routing is formed on a second surface of the PCB; and the second routing further includes vias for electrically coupling the part of the second routing on the first surface with the another part of the second routing on the second surface.

6. The circuit layout of claim 1, wherein the at least one set of connection component(s) includes at least one of the following: a zero-ohm resistor; a jumper; and a dual in-line package (DIP) switch.

7. The circuit layout of claim 1, wherein each of the transmission interface of the CPU, the transmission interface of the first module, and the transmission interface of the second module is a Serializer/Deserializer (SerDes) interface.

8. A circuit layout of a printed circuit board (PCB), the circuit layout comprising:
a first routing including a first set of front-end transmission line(s), a first set of bonding pads, a first set of bridge pads, and a first set of back-end transmission line(s), wherein:
the first set of front-end transmission line(s) is coupled with a transmission interface of a central processing unit (CPU) and coupled with the first set of bonding pads;
the first set of bonding pads includes first bonding pads, wherein any two of the first bonding pads alone are separate;
the first set of bridge pads includes first bridge pads, wherein any two of the first bridge pads alone are separate while any one of the first bridge pads and any one of the first bonding pads alone are separate; and
when the circuit layout is used for a first purpose, the first set of back-end transmission line(s) is coupled with the first set of bonding pads and coupled with a transmission interface of a first module;
a second routing including a second set of transmission circuit(s), wherein when the circuit layout is used for a second purpose, the second set of transmission circuit(s) is coupled with the first set of bridge pads and coupled with a transmission interface of a second module; and
at least one set of connection component(s),
wherein:
when the circuit layout is used for the first purpose, the at least one set of connection component(s) includes a first set of connection component(s), in which the first set of connection component(s) couples multiple bonding pads of the first bonding pads together and thereby electrically couples the first set of front-end transmission line(s) with the first set of back-end transmission line(s) so that the transmission interface of the CPU is electrically coupled with the transmission interface of the first module while the first set of bonding pads and the first set of bridge pads are electrically separate; and
when the circuit layout is used for the second purpose, the at least one set of connection component(s) includes a second set of connection component(s), in which the second set of connection component(s) couples the first set of bonding pads with the first set of bridge pads and thereby electrically couples the first set of front-end transmission line(s) with the second set of transmission circuit(s) so that the transmission interface of the CPU is electrically coupled with the transmission interface of the second module while any two of the first bonding pads are electrically separate.

9. The circuit layout of claim 8, wherein:
the second set of transmission circuit(s) includes a second set of front-end transmission line(s), a second set of bonding pads, and a second set of back-end transmission line(s), wherein:
the second set of front-end transmission line(s) is coupled with the first set of bridge pads and coupled with the second set of bonding pads;
the second set of bonding pads includes second bonding pads, in which any two of the second bonding pads alone are separate; and
the second set of back-end transmission line(s) is coupled with the second set of bonding pads, and when the circuit layout is used for the second purpose, the second set of back-end transmission line(s) is coupled with the transmission interface of the second module, wherein when the circuit layout is used for the second purpose, the at least one set of connection component(s) further includes a third set of connection component(s) which couples multiple bonding pads of the second bonding pads together and thereby electrically couples the second set of front-end transmission line(s) with the second set of back-end transmission line(s).

10. The circuit layout of claim 8, wherein the second set of transmission circuit(s) includes a second set of transmission line(s), in which the second set of transmission line(s) is coupled with the first set of bridge pads and when the circuit layout is used for the second purpose, the second set of transmission line(s) is coupled with the transmission interface of the second module.

11. The circuit layout of claim 8, wherein the first routing is formed on a first surface of the PCB; the second routing is formed on a second surface of the PCB; and the first routing is electrically coupled to the second routing through at least one via.

12. The circuit layout of claim 8, wherein the at least one set of connection component(s) includes at least one of the following: a zero-ohm resistor; a jumper; and a dual in-line package (DIP) switch.

13. The circuit layout of claim 8, wherein each of the transmission interface of the CPU, the transmission interface of the first module, and the transmission interface of the second module is a Serializer/Deserializer (SerDes) interface.

\* \* \* \* \*